(12) United States Patent
Park et al.

(10) Patent No.: US 7,759,862 B2
(45) Date of Patent: Jul. 20, 2010

(54) FIXING A PIXEL DEFECT IN A DISPLAY DEVICE

(75) Inventors: Seung-kyu Park, Gyeonggi-do (KR); Jong-moo Huh, Gyeonggi-do (KR); Sang-goo Jeon, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 390 days.

(21) Appl. No.: 11/604,095

(22) Filed: Nov. 22, 2006

(65) Prior Publication Data

US 2007/0120476 A1 May 31, 2007

(30) Foreign Application Priority Data

Nov. 25, 2005 (KR) .................. 10-2005-0113611

(51) Int. Cl.
*H01J 1/62* (2006.01)
(52) U.S. Cl. .................. 313/506; 313/504; 313/505
(58) Field of Classification Search .......... 313/498–512
See application file for complete search history.

(56) References Cited

FOREIGN PATENT DOCUMENTS

| JP | 2003-233329 | 8/2003 |
|---|---|---|
| JP | 2004-006339 | 1/2004 |
| KR | 1020040098603 | 11/2004 |
| KR | 1020050050001 | 5/2005 |
| WO | 2004068446 A1 | 8/2004 |

OTHER PUBLICATIONS

English Translation of Korea Search Report/Office Action, Patent Application No. 10-2005-0113611, dated Dec. 12, 2006, 1 page.
Korean Office Action/Search Report, 10-2005-0113611, dated Dec. 12, 2006, 11 pages.
English Language Abstract, KR Patent First Publication No. 1020050050001, May 27, 2005, 1 page.
English Language Abstract, KR Patent First Publication No. 1020040098603, Nov. 20, 2004, 1 page.
English Language Abstract, JP Patent First Publication No. 2004-006339, Jan. 8, 2004, 1 page.
English Language Abstract, JP Patent First Publication No. 2003-233329, Aug. 22, 2003, 1 page.

*Primary Examiner*—Bumsuk Won
(74) *Attorney, Agent, or Firm*—Innovation Counsel LLP

(57) ABSTRACT

A display device that lends itself to easy repair of a defective pixel is presented. The device includes: a thin film transistor formed having a first electrode and a second electrode, the second electrode having a first part facing the first electrode, a second part that protrudes from the first part and having a first width, and a third part that extends from the second part and having a second width which is different from the first width. The device also includes a wall encompassing the pixel electrode and a common electrode formed on the wall.

In one version of the repairing process, the second part of the second electrode is coupled to the common electrode. This coupling causes electric current from the second electrode to flow to the common electrode instead of to a light emitting diode, thereby converting a white spot to a black spot.

9 Claims, 18 Drawing Sheets

412 222 310 450    110

US 7,759,862 B2

FIXING A PIXEL DEFECT IN A DISPLAY DEVICE

CROSS-REFERENCE TO RELATED APPLICATIONS

This application claims the benefit of Korean Patent Application No. 2005-0113611 filed on Nov. 25, 2005, in the Korean Intellectual Property Office, the disclosure of which is incorporated herein by reference.

BACKGROUND OF THE INVENTION

1. Field of the Invention

The present invention relates to a display device, and more particularly to a display device that lends itself to easy repair of a defective pixel.

2. Description of the Related Art

Recently, an organic light emitting diode (OLED), among flat panel displays, has become popular due to its low driving voltage, slim shape, light weight, a wide viewing angle, and short response time, among other advantages.

In an active-matrix OLED, a thin film transistor thin film transistor is connected to each pixel area to control the organic light-emitting layer's emission by pixel areas. A pixel electrode is disposed in each pixel area and electrically separated from the adjacent pixel electrodes in order to be driven independently. A hole-injecting layer and the organic light-emitting layer are formed sequentially on the pixel electrodes.

In the OLED, each pixel area has a plurality of thin film transistors, generally a switching thin film transistor connected to a data line and a driving thin film transistor connected to a voltage supply line. In addition, extra transistors may be included, for example for a compensation circuit or the like.

Due to the complicated configuration of each pixel, an OLED often gets a defective pixel. One of the common defects is the formation of a white spot caused by the light-emitting layer being supplied with an electric current continuously. The white spot degrades the display quality, as it may easily be recognized by a viewer.

SUMMARY OF THE INVENTION

The present invention provides a display device that is easily repaired and a method of manufacturing such display device.

The foregoing and/or other aspects of the present invention are also achieved by providing a display device that includes: an insulating substrate; a thin film transistor formed on the insulating substrate and including a first electrode and a second electrode, the second electrode having a first part facing the first electrode, a second part protruding from the first part and having a first width, and a third part extending from the second part and having a second width that is different from the first width; a pixel electrode connected to the second electrode; a wall encompassing the pixel electrode; an organic layer formed on the pixel electrode; and a common electrode formed on the wall and the organic layer.

The foregoing and/or other aspects of the present invention are also achieved by providing a display device comprising: an insulating substrate; a thin film transistor formed on the insulating substrate; a pixel electrode connected to the thin film transistor; a wall encompassing the pixel electrode; an organic layer formed on the pixel electrode; and a common electrode formed on the wall and the organic layer. The thin film transistor has a repair region that is not covered by the pixel electrode, the repair region being located for removal during pixel repair.

The foregoing and/or other aspects of the present invention are also achieved by providing a method of manufacturing a display device including: forming a thin film transistor that has a first electrode and a second electrode on an insulating substrate, the second electrode including a first part facing the first electrode, a second part protruding from the first part and having a first width, and a third part extending from the second part and having a second width that is different from the first width. The method also includes forming a pixel electrode connected to the second electrode; forming a wall encompassing the pixel electrode; forming an organic layer on the pixel electrode; and forming a pixel by forming a common electrode on the wall and the organic layer.

In another aspect, the invention is a method of manufacturing a display device that includes: forming a thin film transistor on an insulating substrate; forming a pixel electrode connected to the thin film transistor; forming a wall encompassing the pixel electrode; forming an organic layer on the pixel electrode; forming a pixel by forming a common electrode on the wall and the organic layer; detecting whether the pixel is defective; and repairing a defective pixel by blocking an electric current applied from the thin film transistor to the pixel electrode in the defective pixel.

BRIEF DESCRIPTION OF THE DRAWINGS

The above and/or other aspects and advantages of the present invention will become apparent and more readily appreciated from the following description of the exemplary embodiments, taken in conjunction with the accompanying drawings, of which.

DETAILED DESCRIPTION OF THE EMBODIMENT(S)

Figure 1:
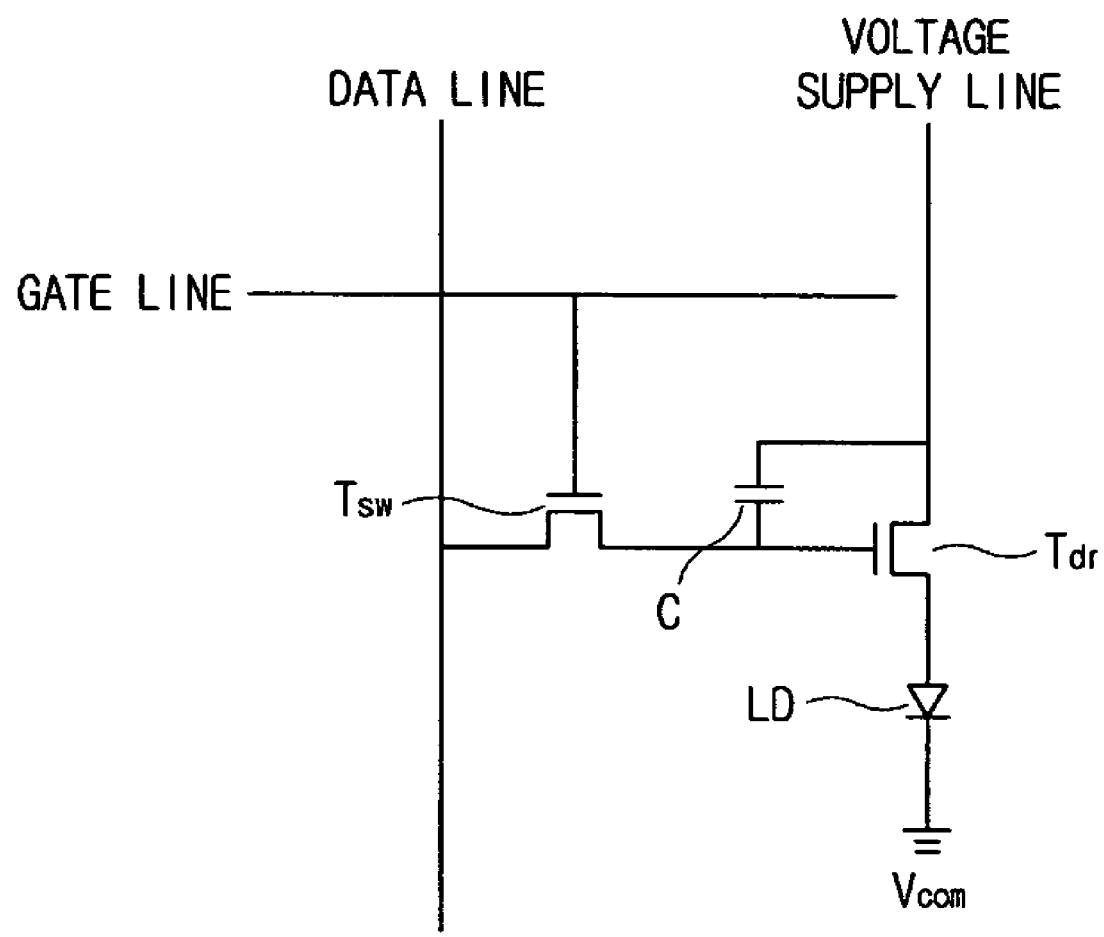
FIG. 1 is an equivalent circuit diagram of a pixel in a display device according to a first embodiment of the present invention.

Reference will now be made in detail to exemplary embodiments of the present invention, examples of which are illustrated in the accompanying drawings, wherein like reference numerals refer to like elements throughout. The embodiments are described below in order to explain the present invention by referring to the figures.

In the following description, if a layer is said to be formed "on" another layer, then a third layer may be disposed between the two layers or the two layers may be contacting each other. In other words, it will be understood that when an element such as a layer, film, region, or substrate is referred to as being "on" another element, it can be directly on the other element or intervening elements may be present.

FIG. 1 is an equivalent circuit diagram of a pixel in a display device according to a first embodiment of the present invention.

A pixel has a plurality of signal lines. The signal lines include a gate line transmitting a scan signal, a data line transmitting a data signal, and a voltage supply line transmitting a driving voltage. The data line and the voltage supply line are disposed parallel to each other, and the gate line extends perpendicularly to the data line and the voltage supply line.

Each pixel comprises a light emitting diode element LD, a switching thin film transistor Tsw, a driving thin film transistor Tdr, and a capacitor C.

The driving thin film transistor Tdr has a control terminal, an input terminal, and an output terminal. The control terminal is connected to the switching thin film transistor Tsw, the input terminal is connected to the voltage supply line, and the output terminal is connected to the light emitting diode element LD.

The light emitting diode element LD comprises an anode connected to the output terminal of the driving thin film transistor Tdr and a cathode connected to a common voltage Vcom. The light emitting diode element LD emits light with varying intensity depending on the electric current outputted from the driving thin film transistor Tdr to display an image. The electric current from the driving thin film transistor Tdr varies in its intensity according to voltage between the control terminal and the output terminal.

The switching thin film transistor Tsw has a control terminal, an input terminal, and an output terminal. The control terminal is connected to the gate line, the input terminal is connected to the data line, and the output terminal is connected to the control terminal of the driving thin film transistor Tdr. The switching thin film transistor Tsw transmits the data signal applied to the data line to the driving thin film transistor Tdr according to the scan signal applied to the gate line.

The capacitor C is connected between the control terminal and the input terminal of the driving thin film transistor Tdr. The capacitor C charges and maintains the data signal inputted to the control terminal of the driving thin film transistor Tdr.

Hereafter, a configuration of the display device 1 according to the first embodiment of the present invention will be described with reference to FIGS. 2 and 3.

Figure 2:
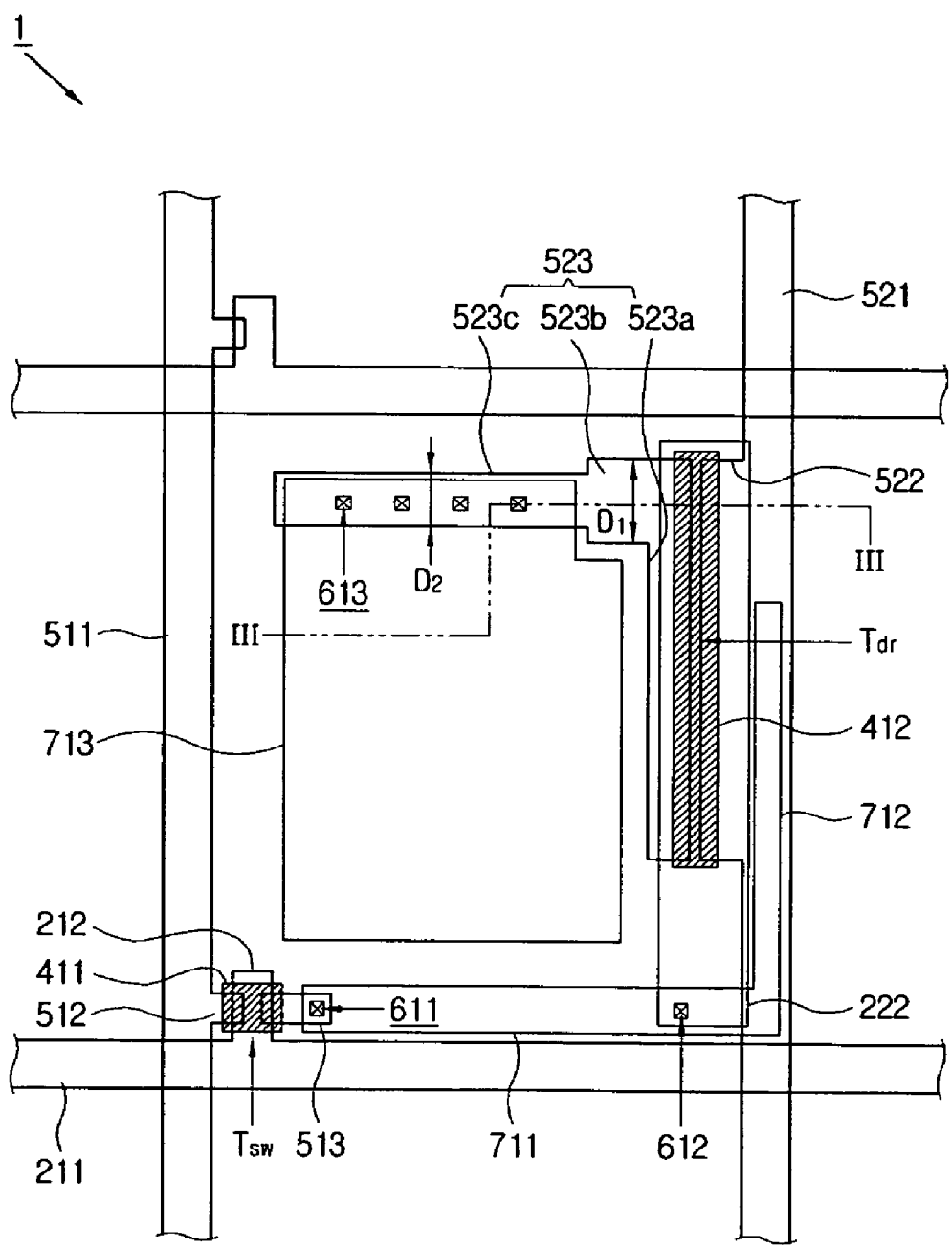
FIG. 2 is an arrangement view of the display device according to the first embodiment of the present invention.
Figure 3:
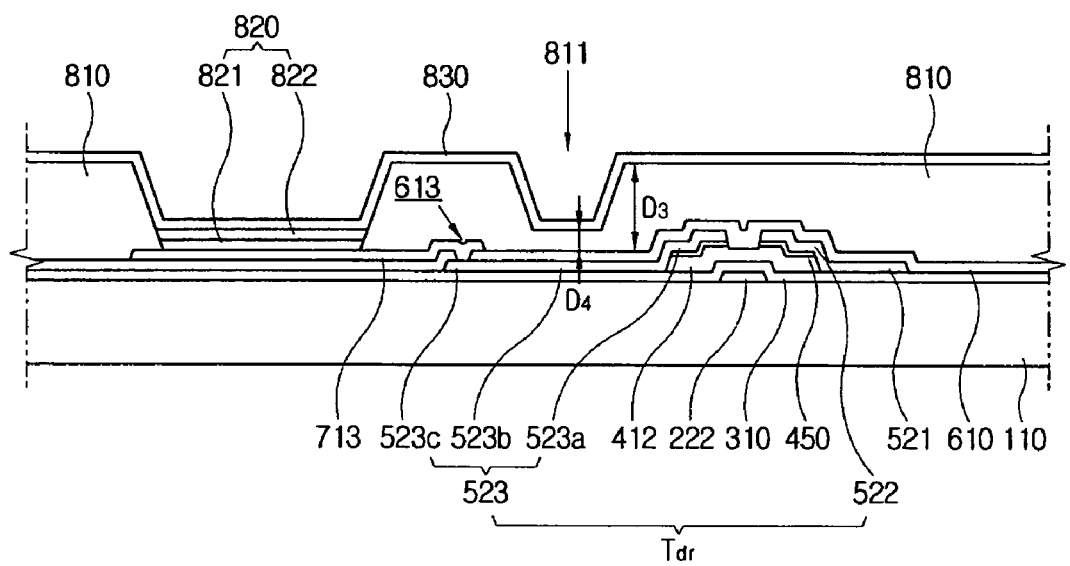
FIG. 3 is a sectional view, taken along the line III-III in FIG. 2.

FIG. 2 is an arrangement view of the display device according to the first embodiment of the present invention, and FIG. 3 is a section view, taken along the line 111-111 in FIG. 2.

As shown in FIGS. 2 and 3, a gate line assembly is formed on an insulating substrate 110 made of transparent glass. The "gate line assembly" is herein refers collectively to the gate line 211 extending in a first direction, a switching gate electrode 212 extending from the gate line 211 in a second direction, and a driving gate electrode 222 separated from the gate line 211. The gate line assembly is made of a metal layer and may have a single-layered structure or a multi-layered structure.

The gate line 211 transmits the scan signal and extends in the first direction, perpendicularly to the data line 511. The gate line 211 may have a wide end portion (not shown) for connection to another layer or an external device. If a gate driving circuit (not shown) generating the scan signal is integrated into the insulating substrate 110, the gate line 211 may directly be connected to the gate driving circuit.

The switching gate electrode 212 is connected to the gate line 211 and functions as the control terminal of the switching thin film transistor Tsw. The driving gate electrode 222 is the control terminal of the driving thin film transistor Tdr and is connected to a switching drain electrode 513 of the switching thin film transistor Tsw.

A gate insulating layer 310, which contains silicon nitride (SiNx), is formed on the insulating substrate 110 and the gate line assembly.

A semiconductor layer containing amorphous silicon is formed on the gate insulating layer 310. The "semiconductor layer" herein refers to a switching semiconductor layer 411 disposed on the switching thin film transistor Tsw and a driving semiconductor layer 412 disposed on the driving thin film transistor Tdr. The switching semiconductor 411 is an island and the driving semiconductor 412 extends in the second direction along the driving gate electrode 222. the switching semiconductor layer 411 and the driving semiconductor layer 412 may be formed at an intersection of the gate line 211 and the data line 511 and an intersection of the gate line 211 and the voltage supply line 521.

An ohmic contact layer 450 comprising n+ hydrogenated amorphous silicon highly doped with n-type dopant is formed between the semiconductor layer and a data line assembly. The "data line assembly" refers collectively to a data line 511, a switching source electrode 512, a switching drain electrode 513, a voltage supply line 521, a driving source electrode 522, and a driving drain electrode 523. The data line assembly is formed on the ohmic contact layer 450 and the portion of the gate insulating layer 310 that is not covered with the ohmic contact layer 450.

The data line 511 and the switching source electrode 512 are formed in a single body, and the voltage supply line 521 and the driving source electrode 522 are formed in a single body.

The data line 511 transmits the data signal and extends in the second direction to cross the gate line 211. The data line 511 may have a wide end portion (not shown) for connection to another layer or an external device. If a data driving circuit (not shown) generating the data signal is integrated into the insulating substrate 110, the data line 511 may directly be connected to the data driving circuit. The switching source electrode 512 is formed in a single body with the data line 511 and functions as the input terminal of the switching thin film transistor Tsw.

The switching drain electrode 513 of the switching thin film transistor Tsw is connected to the driving gate electrode 222 of the driving thin film transistor Tdr.

The voltage supply line 521 is disposed parallel to the data line 511 and supplies the driving voltage to the driving source electrode 522 of the driving thin film transistor Tdr. The driving source electrode 522 is formed in a single body with a voltage supply line 521 and extends in a second direction.

The driving drain electrode 523 has a first part 523a formed parallel to the driving source electrode 522, a second part 523b protruding from the first part 523a, and a third part 523c extending from the second part 523b and connected to a pixel electrode 713.

The width d1 of the second part 523b is larger than the width d2 of the third part 523c. In more detail, the width d1 of the second part 523b is about 110% to about 200% of the width d2 of the third part 523c. The second part 523b has about 0.1% to about 20% of the area of the pixel electrode 713 exposed by a wall 810, or is in the range of about 10 μm² and about 40 μm². The second part 523b electrically couples with the common electrode 830 upon being irradiated with a laser beam during the repair process for the defective pixel. If the second part 523b has a small area, it is not easy to aim the laser beam properly. On the other hand, if the second part 523b has a large area, the aperture ratio undesirably decreases.

A passivation layer 610 is formed on the data line assembly (511, 512, 513, 521, 522 and 523) and the portion of the semiconductor layer (411 and 412) that is not covered with the data line assembly (511, 512, 513, 521, 522 and 523). The passivation layer 610 includes silicon nitride (SiNx).

The passivation layer 610 is partially removed to form a contact hole 611 exposing the switching drain electrode 513, a contact hole 612 exposing the driving gate electrode 222, and a contact hole 613 exposing the third part 523c of the driving drain electrode 523. Here, the gate insulating layer 310 is also removed from the contact holes 612 and 613.

Transparent electrodes are formed on the passivation layer 610. The "transparent electrodes" herein refer to a bridge 711, a capacity forming part 712, and a pixel electrode 713. The transparent electrodes are made of a transparent conductive material such as indium tin oxide (ITO) or indium zinc oxide (IZO).

The bridge 711 connects the switching drain electrode 513 of the switching thin film transistor Tsw to the driving gate electrode 222 of the driving thin film transistor Tdr. For the connection using the bridge 711, the switching drain electrode 513 and the driving gate electrode 222 are exposed through the contact holes 611 and 612, respectively.

The capacity forming part 712 is formed in a single body with the bridge 711 and extends under the voltage supply line 521. Storage capacity is formed in the passivation layer 610 where the capacity forming part 712 and the voltage supply line 521 overlap each other.

The pixel electrode 713, which functions as an anode, provides holes to an organic layer 820. The pixel electrode 713 is connected to the third part 523c of the driving drain electrode 523 through the contact hole 613.

A wall 810 is formed between the adjacent pixel electrodes 713. The wall 810 divides the pixel electrodes 713 to define a pixel area and is formed on the thin film transistors Tsw and Tdr. The wall 810 may contain photoresist having thermal resistance and solvent-resisting property, such as acrylic resin, polyimide resin and etc., an inorganic material, such as $SiO_2$ and $TiO_2$, or a double-layered structure having an organic layer and an inorganic layer.

A caved-in part 811 is formed on the wall 810 covering the second part 523b of the driving drain electrode 523. The thickness d3 of the wall 810 where the caved-in part 811 is not formed is in the range of about 3 μm to 5 μm, and the thickness d4 of the wall 810 where the caved-in part 811 is formed is in the range of about 0.5 μm to 2 μm. If the thickness d4 is smaller than 0.5 μm, the distance between the common electrode 830 and the driving drain electrode 523 becomes too short and parasitic capacitance is generated. If the thickness d4 is larger than 2 μm, it is not easy to electrically couple the second part 523b of the driving drain electrode 523 to the common electrode 830 using the laser beam.

The organic layer 820 is formed on a portion of the pixel electrode 713 not covered with the wall 810. The organic layer 820 comprises a hole-injecting layer 821 and a light-emitting layer 822.

The hole injecting layer 821 contains a hole injecting material, such as poly-3,4-ethylenedioxythiophene (PEDOT) and poly styrenesulfonate (PSS) and is formed by ink-jetting the hole injecting material in an aqueous suspension state.

The light-emitting layer 822 contains polyfluorene derivatives, poly(p-phenylene vinylene) derivatives, polyphenylene derivatives, poly(N-vinylcarbazole) derivatives and poly thiophene derivatives or compounds thereof doped with a perillene group pigment, rhodamine, rubrene, perillene, 9,10-diphenylanthracene, tetraphenylbutadiene, nile red, cumarine 6, quinacridone and etc. The light-emitting layer 822 may be formed by ink-jetting.

Holes transmitted from the pixel electrode 713 and electrons transmitted from the common electrode 830 combine with each other in the light-emitting layer 822 to become excitons, and then the excitons generate light while inactivated.

The common electrode 830 is disposed on the wall 810 and the light-emitting layer 822. The common electrode 830 functions as a cathode and provides electrons to the light-emitting layer 822. The common electrode 830 includes a calcium layer and an aluminum layer. In this case, a layer having low work function is preferably disposed close to the light-emitting layer 822.

Lithium fluoride may enhance the light-emitting efficiency depending on the material that makes up the light-emitting layer 822, and thus a lithium fluoride layer may be formed between the light-emitting layer 822 and the common electrode 830. If the common electrode 830 is made of a non-transparent material such as aluminum or silver, light emitted from the light-emitting layer 822 exits to the insulating substrate 110. This is called a bottom emission method.

The display device 1 may further comprise an electron transfer layer (not shown) and an electron injection layer (not shown) between the light-emitting layer 822 and the common electrode 830. Moreover, the display device 1 may further comprise an additional passivation layer to protect the common electrode 830 and an encapsulation member bag to prevent moisture and air from penetrating into the organic layer 820. The encapsulation member may comprise sealing resin and a sealing can.

Hereinafter, a manufacturing method of a display device according to the first embodiment of the present invention will be described with reference to FIGS. 2, 3, and 4A through 4G.

Figure 4A:
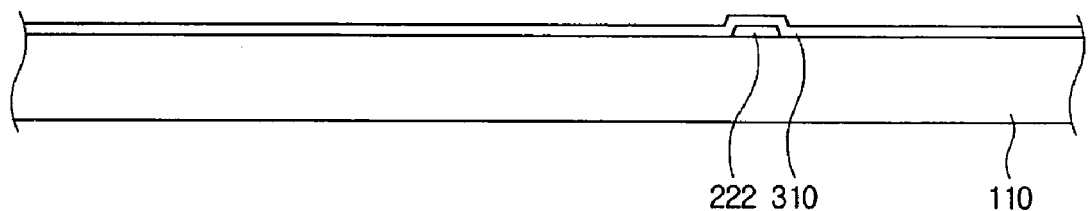
FIGS. 4A through 4G are sectional views to illustrate a manufacturing method of a display device according to the first embodiment of the present invention.

Referring to FIG. 4A, a gate metal layer is formed on the insulating substrate 110 and patterned to form the gate line assembly (211, 212 and 222). The gate metal layer is formed across the insulating substrate 110 by sputtering. Then, the gate insulating layer 310 is formed on the gate line assembly 211, 212 and 222. The gate insulating layer 310 comprises silicon nitride and is formed by chemical vapor deposition (CVD).

Figure 4B:
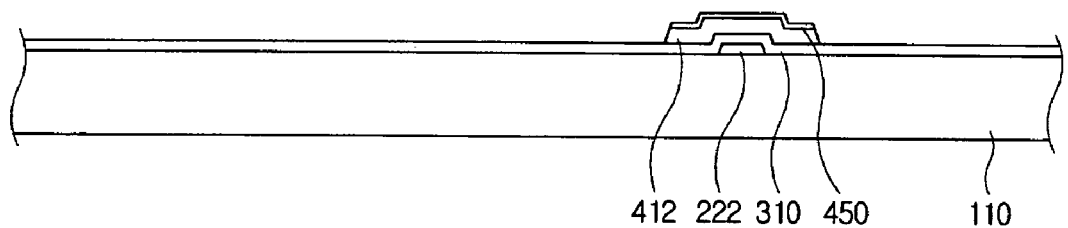

Referring to FIG. 4B, the semiconductor layer 411 and 412 and the ohmic contact layer 450 are formed on the gate insulating layer 310. The gate insulating layer 310, the semiconductor layer (411 and 412), and the ohmic contact layer 450 may be formed sequentially.

Figure 4C:
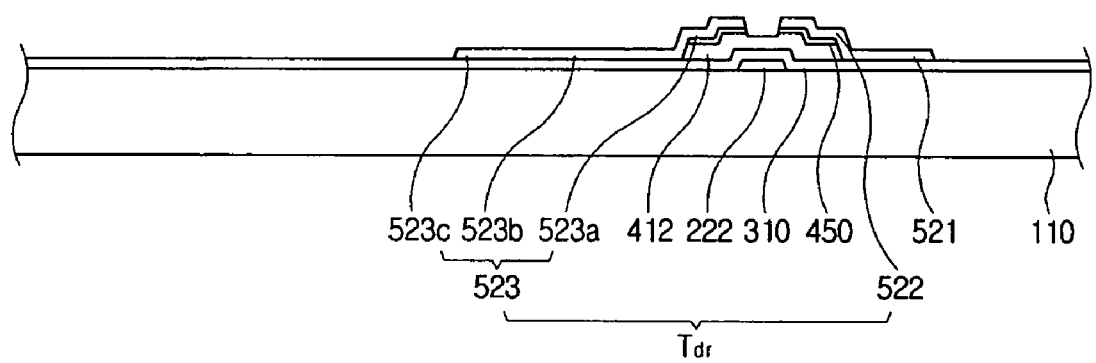

Referring to FIG. 4C, a data metal layer is formed and patterned to form the data line assembly (511, 512, 513, 521, 522 and 523). The data metal layer is formed across the insulating substrate 110 by sputtering. In this process, a portion of the ohmic contact layer 450 which is not covered with the data line assembly (511, 512, 513, 521, 522 and 523) is removed. Thereafter, oxygen plasma is preferably performed to stabilize the surface of the semiconductor layer 411 and 412 which is exposed. The ohmic contact layer 450 may be etched by dry etching using plasma. When forming the data line assembly (511, 512, 513, 521, 522 and 523), the second part 523b of the driving drain electrode 523 is formed more widely than the third part 523c thereof.

Figure 4D:
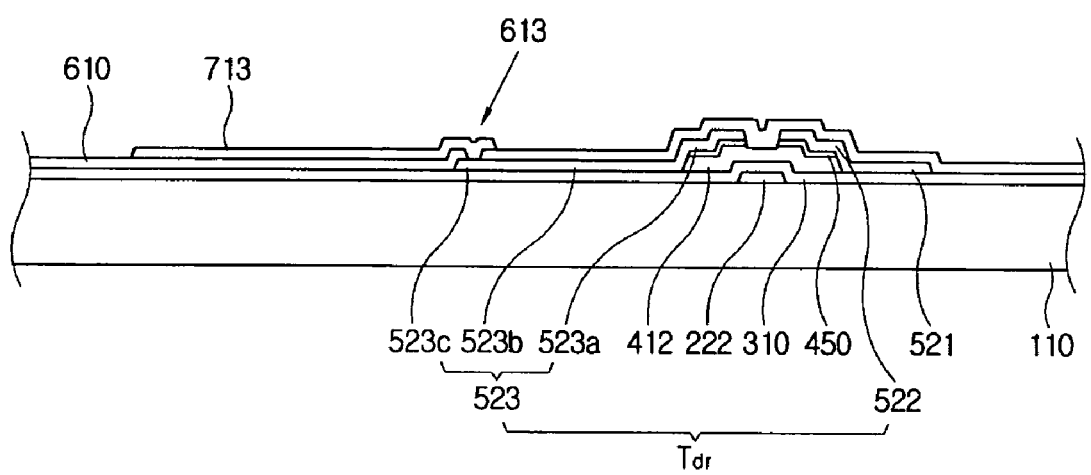
Figure 4E:
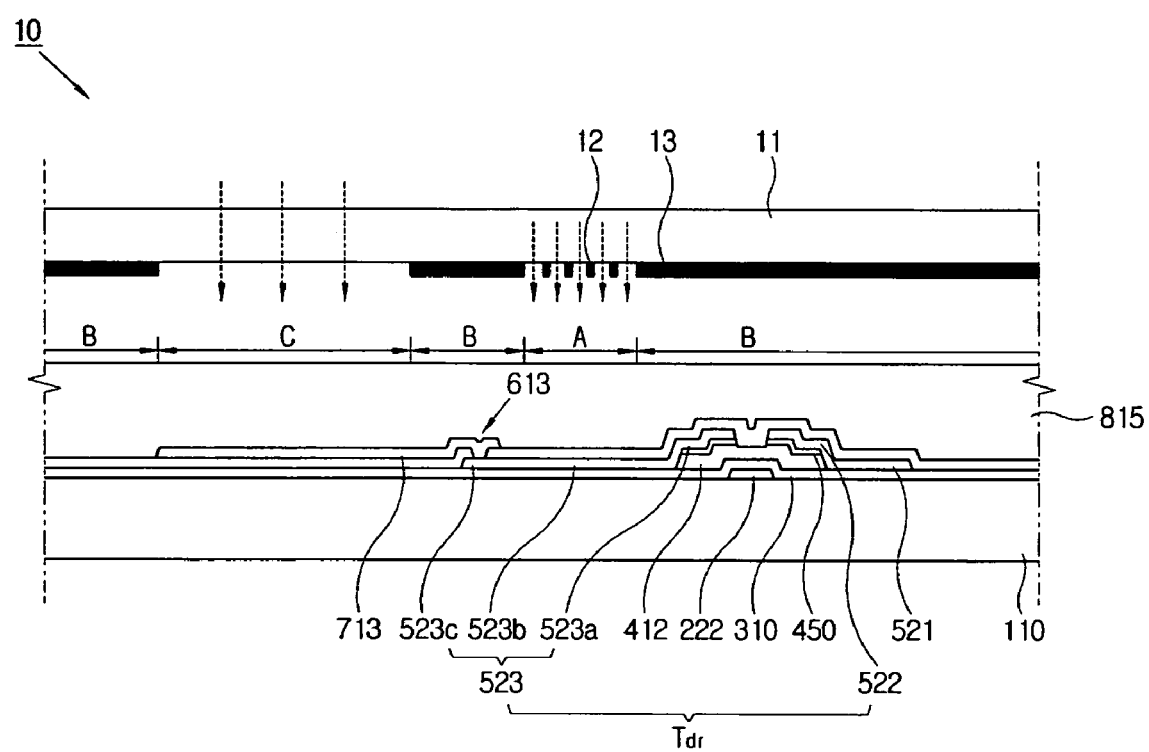

Referring to FIG. 4D, the passivation layer 610 and the transparent electrodes (711, 712 and 713) are formed. The passivation layer 610 contains silicon nitride and is formed by CVD. The passivation layer 610 is patterned to form the contact holes 611, 612 and 613. Here, the contact hole 613 exposing the driving drain electrode 523 is formed to correspond to the third part 523c.

A transparent conductive layer comprising ITO or IZO is deposited and etched by photolithography to form the transparent electrodes 711, 712 and 713. Preferably, nitrogen gas is used in a pre-heating process before the ITO or IZO is deposited. The pixel electrode 713 is formed so as not to overlap with the second part 523b of the driving drain electrode 523.

Referring to 4E, a photoresist layer 815 is formed and exposed using a mask 10. The photoresist layer 815 is a positive type in which an exposed area is resolved, and may be formed by a slit coating method or a spin coating method.

The mask 10 includes a base substrate 11 made of quartz and a light shield layer formed on the base substrate 11. The light shield layer does not transmit ultraviolet rays and contains chrome oxide.

The light shield layer has a first sub-layer 12 corresponding to an area A where the caved-in part 811 of the wall 810 is formed and a second sub-layer 13 corresponding to an area B where the caved-in part 811 is not formed. There is a slit pattern in the first sub-layer 12.

The area A of the photoresist layer 815 corresponding to the first sub-layer 12 is exposed to be partially resolved. The area B corresponding to the second sub-layer 13 is not resolved by exposure to the light. The area C corresponding to a portion of the mask 10 where the light shield layer 12 and 13 is not formed is completely resolved. Then, the photoresist 815 is developed and a resolved area is removed, thereby forming the wall 810 where the caved-in part 811 is formed on the second part 523b of the driving drain electrode 523.

Figure 4F:
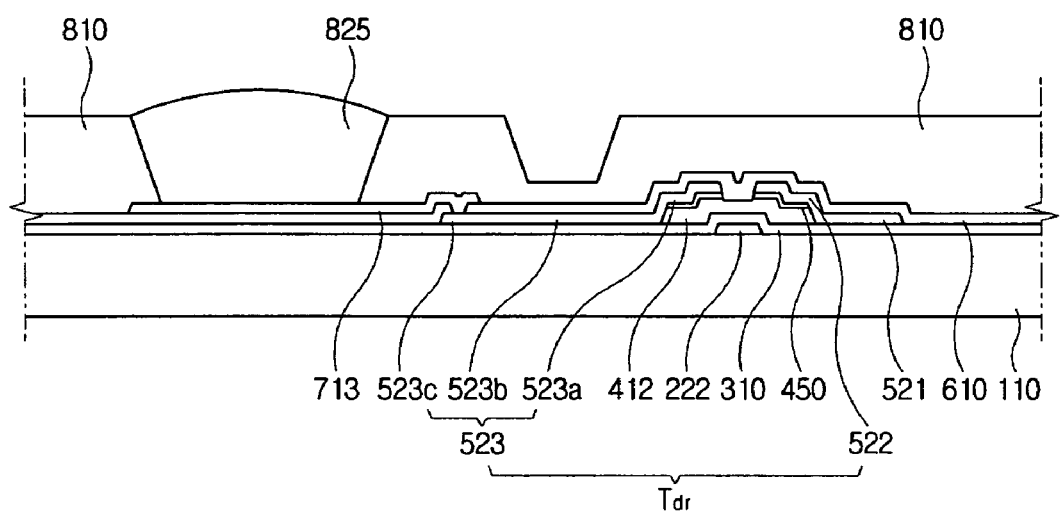

FIG. 4F shows that a hole-injecting solution 825, which is a polymer solution containing a hole-injecting material, is dropped onto the pixel electrode 713 by ink-jetting. The hole-injecting solution 825 may contain poly thiophene derivatives such as poly-3,4-ethylenedioxythiophene (PEDOT), poly styrenesulfonate (PSS) and a polar solvent. The polar solvent, for example, may be isopropyl alcohol (IPA), n-butanol, γ-buthylolactone, N-methylpyrrolidone (NMP) and 1,3-dimethyl-2-imidazolidinon (DMI) and derivatives thereof and glycolether such as cabitol acetate, buthyl cabitol acetate or the like.

The hole-injecting solution 825 is dried to form the hole-injecting layer 821. A drying process is performed under nitrogen atmosphere at room temperature at a pressure of 1 Torr. If the pressure is too low, the hole-injecting solution 825 may rapidly boil. Also, if the temperature is more than the room temperature, the evaporation speed of the solvent increases, making it hard to form a layer having a uniform thickness.

After completing the drying process, heat treatment may be performed under nitrogen atmosphere, or preferably in a vacuum, and at about 200° C. for 10 minutes, so that any solvent or water remaining in the hole-injecting layer 821 is removed.

Figure 4G:
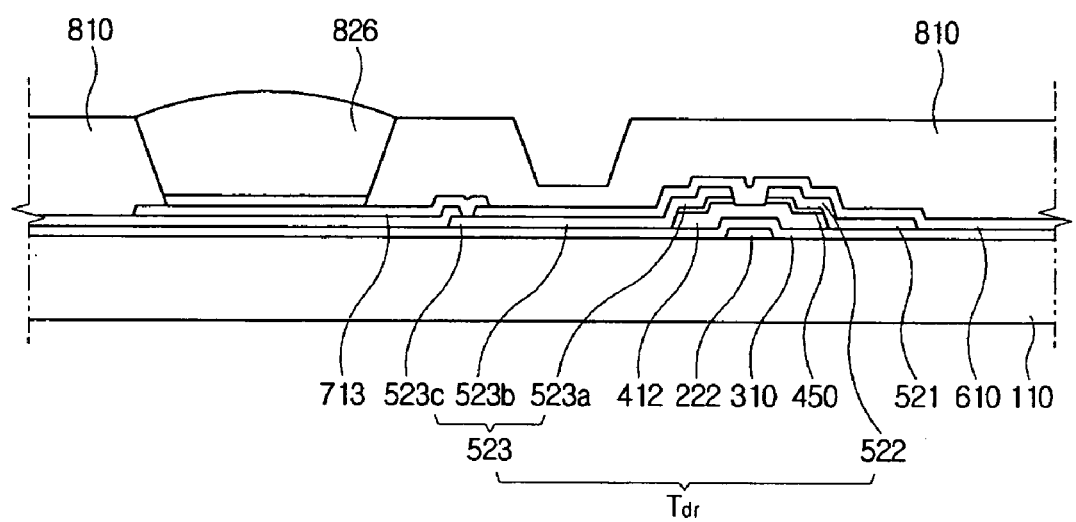

FIG. 4G shows that a light-emitting solution 826, which is a polymer solution containing a light-emitting material, is dropped onto the pixel electrode 613.

The light-emitting solution 826 may contain a nonpolar solvent in which the hole-injecting layer 821 is insoluble. This way, the re-dissolving of the hole-injecting layer is prevented. The nonpolar solvent may contain cyclohexylbenzene, dihydrobenzofuran, trimethylbenzene, tetramethylbenzene and etc.

A problem with the hole-injecting layer 821 is that it has low chemical affinity to the nonpolar solvent. As a result, the light-emitting layer 826 may not adhere closely to the hole-injecting layer 821 or may have a non-uniform thickness where the light-emitting solution 826 that is used contains a nonpolar solvent.

To increase the chemical affinity of the hole-injecting layer 821 to the nonpolar solvent, a surface reforming process is performed on the hole-injecting layer 821 before dropping the light-emitting solution 826.

In the surface reforming process, a surface reforming agent is applied to the hole-injecting layer 821, and then dried and evaporated. The surface reforming agent may contain cyclohexylbenzene, dihydrobenzofuran, trimethylbenzene and tetramethylbenzene, which are the solvent of the light-emitting solution 826, or toluene and xylene which are similar to the aforementioned solvent. The surface reforming agent may be applied by ink-jetting, spin coating or dipping.

A surface of the hole-injecting layer 821 becomes chemically attractive to the nonpolar solvent through the surface reforming process, allowing the light-emitting solution 826 to be uniformly applied.

A drying process of the light-emitting solution 826 is similar to that of the hole-injecting solution 825.

Thereafter, the light-emitting solution 826 is dried to form the light-emitting layer 822, and then the common electrode 830 is formed on the light-emitting layer 822, thereby completing the display device 1 as shown in FIGS. 2 and 3.

Figure 5A:
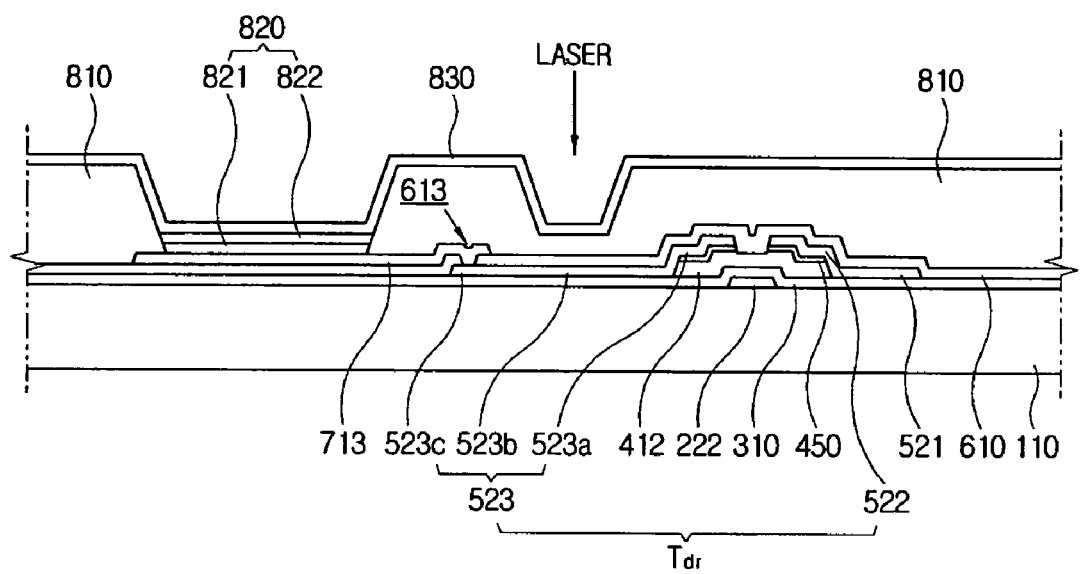
FIGS. 5A and 5B are sectional views to illustrate how to repair a defective pixel in the display device according to the first embodiment of the present invention.
Figure 5B:
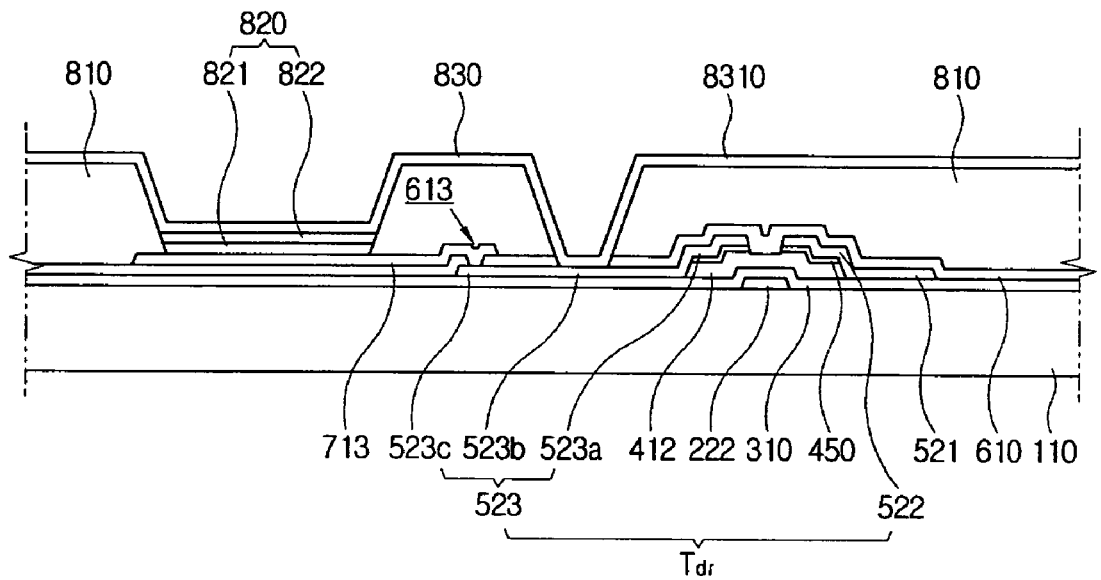

FIGS. 5A and 5B are sectional views that illustrate how to repair a defective pixel in the display device according to the first embodiment of the present invention.

When manufacturing the display device 1, each pixel is inspected for defect through an automatic optical inspection (AOI) or the like. The display device 1 may be inspected while or after being manufactured. Further, the display device 1 may be inspected under a practical condition with a driving circuit mounted thereon.

A pixel that is determined to be defective, especially a pixel that causes the formation of a white spot, is repaired by a laser beam. Upon repair, the white spot is changed to a black spot.

FIG. 5A shows that the second part 523b of the driving drain electrode 523 is irradiated with laser during a pixel repair process, and FIG. 5B shows that the second part 523b becomes electrically coupled to the common electrode 830 by laser irradiation.

The distance between the second part 523b and the common electrode 830 is short since the wall 810 disposed over the second part 523b is thin, and the second part 523b is wide in comparison to the thickness of the wall 810 between the second part 523b and the common electrode 830. Accordingly, the electrical-coupling of the second part 523b with the common electrode 830 can be easily obtained. Further, the pixel electrode 813 is not disposed between the second part 523b and the common electrode 830, and thus the second part 523b directly contacts the common electrode 830. Additionally, the wall 810 over the second part 523b has a particular configuration, so that a manufacturer may easily find where to aim the laser beam.

Figure 6:
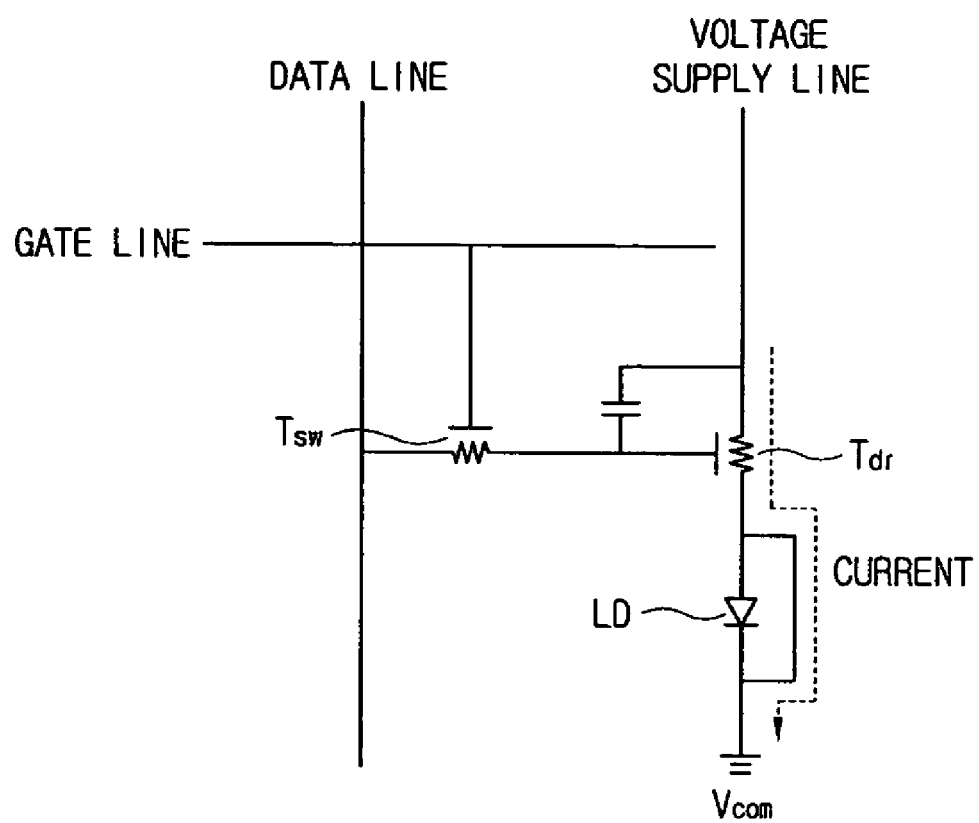
FIG. 6 is an equivalent circuit diagram of a repaired pixel in the display device according to the first embodiment of the present invention.

FIG. 6 is an equivalent circuit diagram of a repaired pixel in the display device according to the first embodiment of the present invention. in the diagram, the switching thin film transistor Tsw and the driving thin film transistor Tdr are assumed to be defective.

An electric current supplied from the voltage supply line is adjusted in its intensity through the driving thin film transistor Tdr and supplied to a light emitting diode element LD. However, a bypass line is formed between the output terminal of the driving thin film transistor Tdr and the common electrode through repair. Most of the electric current from the output terminal of the driving thin film transistor Tdr flows in the common electrode having a relatively low contact resistance rather than the light emitting diode element LD, which has a relatively high contact resistance. Accordingly, the electric current from the driving thin film transistor Tdr is not supplied to the light emitting diode element LD, and the repaired pixel becomes a black spot.

Hereinafter, a display device according to a second embodiment of the present invention will be described with reference to FIGS. 7 and 8.

Figure 7:
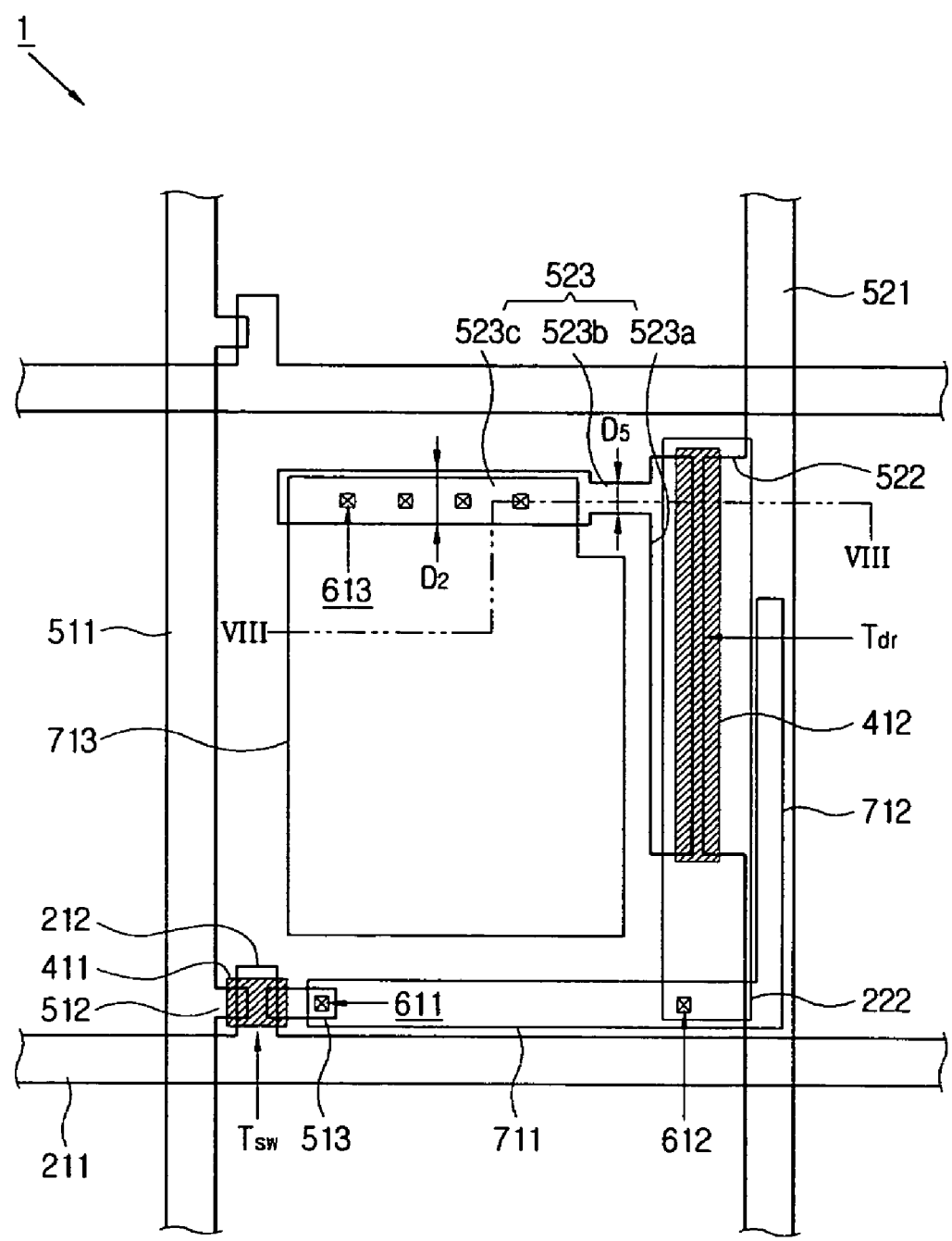
FIG. 7 is an arrangement view of a display device according to a second embodiment of the present invention.
Figure 8:
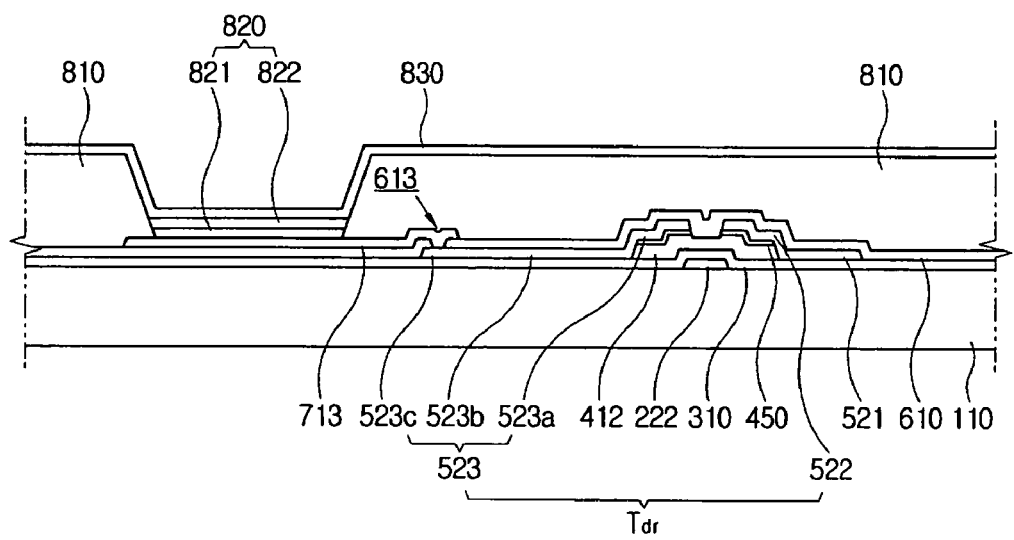
FIG. 8 is a sectional view, taken along the line VIII-VIII in FIG. 7.

FIG. 7 is an arrangement view of the display device according to the second embodiment of the present invention, and FIG. 8 is a sectional view taken along the line VIII-VIII in FIG. 7.

In the second embodiment, the width d5 of a second part 523b of a driving drain electrode 523 is shorter than the width d2 of a third part 523c thereof. In detail, the width d5 of the second part 523b may be in the range of 50% and 90% of the width d2 of the third part 523c. The second part 523b in the second embodiment is to be irradiated with laser when repairing a pixel.

Figure 9A:
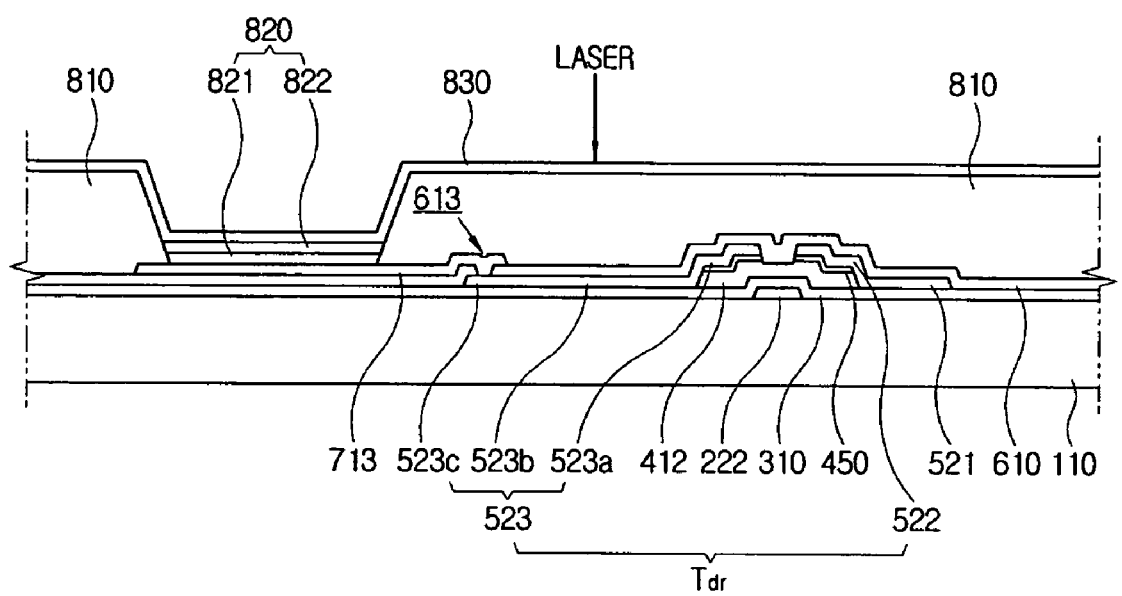
FIGS. 9A and 9B are sectional views to illustrate how to repair a defective pixel in the display device according to the second embodiment of the present invention.
Figure 9B:
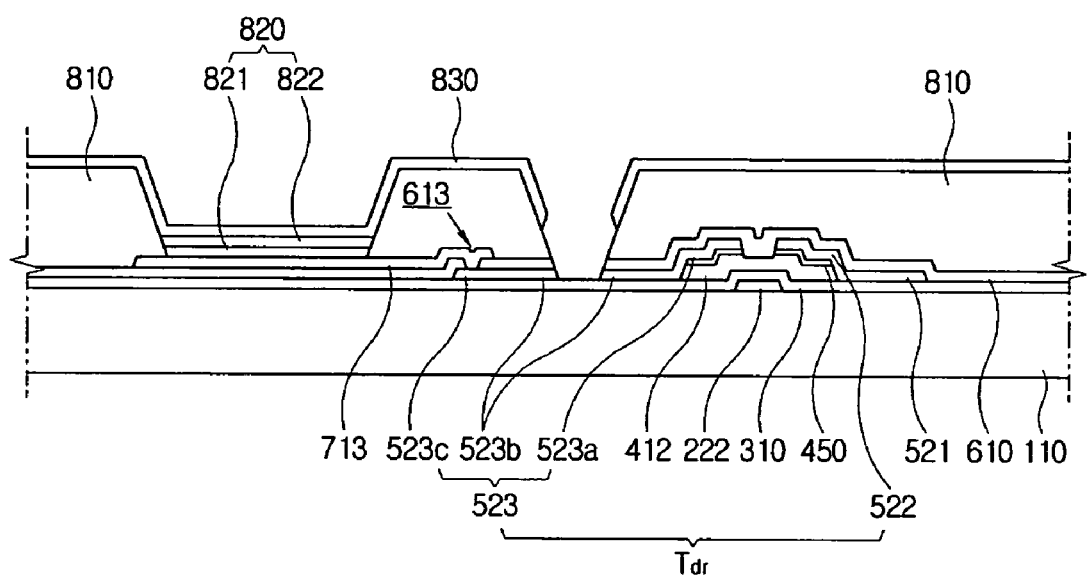

FIGS. 9A and 9B are sectional views to illustrate how to repair a defective pixel in the display device according to the second embodiment of the present invention.

FIG. 9A shows that the second part 523b of the driving drain electrode 523 is irradiated with laser to repair the pixel, and FIG. 9B shows that the first part 523a is disconnected from a third part 523c by laser irradiation.

The second part 523b is comparatively narrow, so that the disconnection of the first part 523a from the third part 523c may be easily performed. The wall 810 disposed over the second part 523b absorbs impurities generated during the laser irradiation process for disconnecting the second part 523b. Further, the pixel electrode 713 is not disposed between the second part 523b and the common electrode 830. Thus, any short-circuiting of the second part 523b with the common electrode 830 is prevented.

Figure 10:
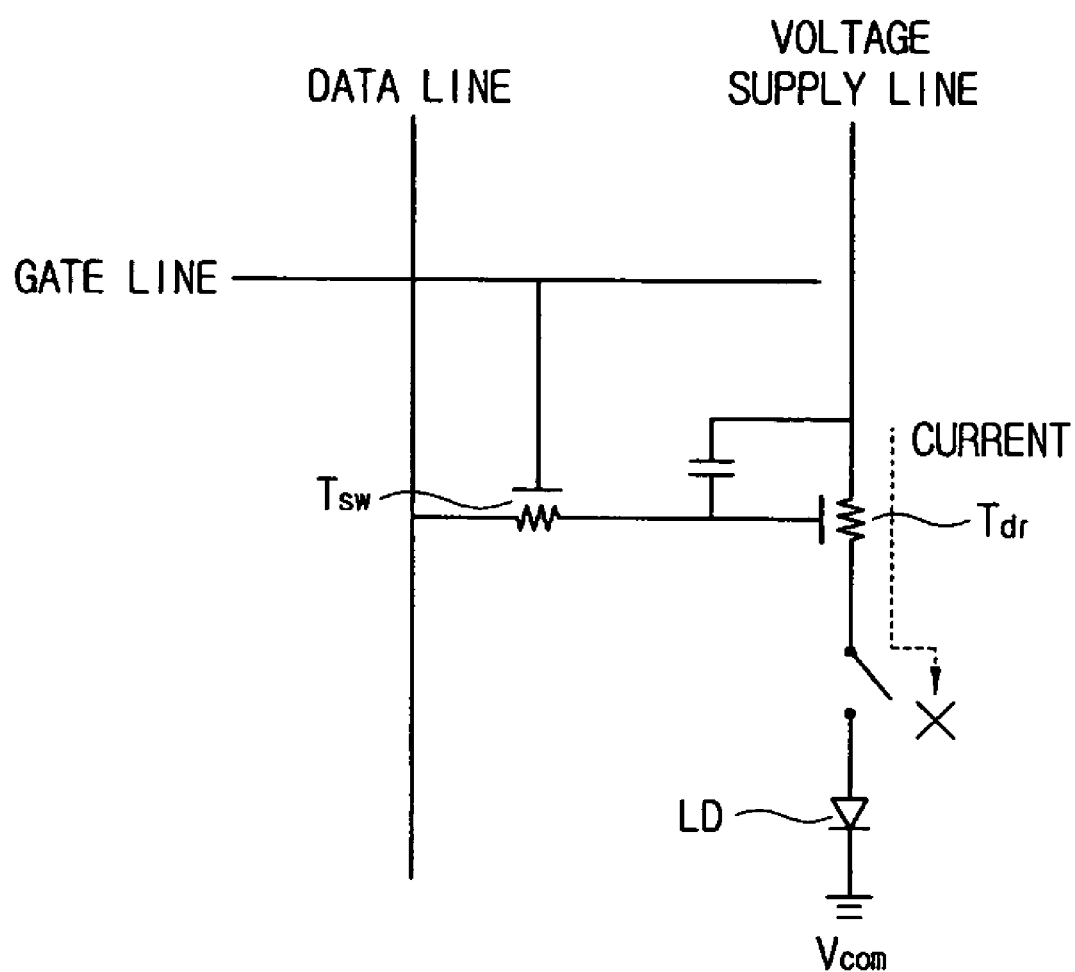
FIG. 10 is an equivalent circuit diagram of a repaired pixel in the display device according to the second embodiment of the present invention.

FIG. 10 is an equivalent circuit diagram of a repaired pixel in the display device according to the second embodiment of the present invention. The switching thin film transistor Tsw and the driving thin film transistor Tdr shown in the equivalent circuit diagram are defective.

An electric current supplied from a voltage supply line is adjusted in its intensity through the driving thin film transistor Tdr and supplied to a light emitting diode element LD. However, the output terminal of the driving thin film transistor Tdr is disconnected from the light emitting diode element LD due to the repair. Thus, the electric current from the driving thin film transistor Tdr is not supplied to the light emitting diode element LD, so that the repaired pixel becomes a black spot. This method does not affect the electrical function of the common electrode or neighboring pixels.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
    an insulating substrate;
    a first thin film transistor formed on the insulating substrate and including a first electrode and a second electrode, the second electrode having a first part facing the first electrode, a second part protruding from the first part and having a first width, and a third part extending from the second part and having a second width that is smaller than the first width, wherein the first, second and third parts are formed from a same layer;
    a pixel electrode connected to the third part of the second electrode;
    a wall encompassing the pixel electrode and covering the second part of the second electrode;
    an organic layer formed on the pixel electrode; and
    a common electrode formed on the wall and the organic layer.

2. The display device according to claim 1, further comprising a passivation layer disposed between the first thin film transistor and the wall and having a contact hole formed thereon to expose the third part of the second electrode,
    wherein the pixel electrode is connected to the second electrode through the contact hole.

3. The display device according to claim 2, wherein the first width is about 110% to about 200% of the second width.

4. The display device according to claim 2, wherein an area of the second part is about 0.1% to about 20% of an area of the pixel electrode exposed by the wall.

5. The display device according to claim 2, wherein the area of the second part is in a range of about 10 μm$^2$ to about 40 μm$^2$.

6. The display device according to claim 2, wherein the second part does not overlap the pixel electrode.

7. The display device according to claim 2, wherein the wall on the second part is thinner than the rest of the wall.

8. The display device according to claim 1, further comprising a gate line and a data line that extend perpendicularly to each other, and a second thin film transistor connected to the gate line and the data line,
    wherein a control terminal of the first thin film transistor is connected to an output terminal of the second thin film transistor.

9. The display device according to claim 8, further comprising a voltage supply line formed parallel to the data line,
    wherein the first electrode is connected to the voltage supply line.

* * * * *